United States Patent
Holesovsky et al.

(10) Patent No.: US 7,480,878 B2
(45) Date of Patent: Jan. 20, 2009

(54) METHOD AND SYSTEM FOR LAYOUT VERSUS SCHEMATIC VALIDATION OF INTEGRATED CIRCUIT DESIGNS

(75) Inventors: Alan Lee Holesovsky, Loveland, CO (US); Viswanathan Lakshmanan, Thornton, CO (US); Brent Wray Acott, Fort Collins, CO (US)

(73) Assignee: LSI Logic Corportion, Milpitas, CA (US)

( * ) Notice: Subject to any disclaimer, the term of this patent is extended or adjusted under 35 U.S.C. 154(b) by 377 days.

(21) Appl. No.: 11/321,260

(22) Filed: Dec. 29, 2005

(65) Prior Publication Data
US 2007/0157140 A1  Jul. 5, 2007

(51) Int. Cl.
G06F 17/50 (2006.01)
(52) U.S. Cl. .......................................................... 716/5
(58) Field of Classification Search ................. 716/4–5, 716/9–11
See application file for complete search history.

(56) References Cited

U.S. PATENT DOCUMENTS

| | | | |
|---|---|---|---|
| 2003/0112576 A1* | 6/2003 | Brewer et al. | 361/119 |
| 2004/0064797 A1* | 4/2004 | Li | 716/5 |
| 2005/0050504 A1* | 3/2005 | Jurgens et al | 716/11 |
| 2005/0097488 A1* | 5/2005 | Lakshmanan et al. | 716/7 |
| 2005/0216873 A1* | 9/2005 | Singh et al. | 716/5 |
| 2005/0229126 A1* | 10/2005 | Wang et al. | 716/5 |
| 2006/0131739 A1* | 6/2006 | Cho et al. | 257/720 |

* cited by examiner

*Primary Examiner*—Paul Dinh
(74) *Attorney, Agent, or Firm*—Yee & Associates

(57) ABSTRACT

A method and system for validating selected layers of an integrated circuit design. A rundeck is edited to include IC layers and device structures of interest that may require validation. In some embodiments the IC layer of interest may include only metal. A layout versus schematic (LVS) comparison is performed using the edited rundeck and an error report is generated.

10 Claims, 10 Drawing Sheets

ALL LAYERS

METAL AND RELATED LAYERS

COMPARISON OF TRIMMED RUN DECK AND CONVENTIONAL RUN DECK

| CONVENTIONAL RUN DECK | TRIMMED RUN DECK |
|---|---|
| LOCATION LAYOUT DATA = PATHA/FILEAAA<br>LOCATION PAD FILE =PATHB/FILEBBB<br>LOCATION CELL DEFINITION = FILE CCC<br>LOCATION SCHEMATIC NETLIST = FILEDDD<br><br>*<br><br>LAYER SUBSTRATE<br>LAYER PWELL<br>LAYER N+IMPLANT<br>LAYER SILICIDE BLK<br>LAYER POLY<br>LAYER CONTACT<br><br>*<br><br>LAYER METAL 1<br>LAYER METAL 2<br>LAYER METAL 3<br>LAYER VIA 12<br>LAYER VIA 23<br><br>CAP734 TOP PLATE = METAL 2<br>CAP734 BOTTOM PLATE = METAL 1<br>* | LOCATION LAYOUT DATA = PATHA/FILEAAA<br>LOCATION PAD FILE =PATHB/FILEBBB<br>LOCATION CELL DEFINITION = FILE CCC<br>LOCATION SCHEMATIC NETLIST = FILEDDD<br><br>*<br><br>LAYER METAL 1<br>LAYER METAL 2<br>LAYER METAL 3<br>LAYER VIA 12<br>LAYER VIA 23<br><br>*** |

FIGURE 8

THIRD PARTY SOFTWARE TOOL
LVS REPORT
"ERROR REPORT"
---
CHIP LEVEL SUMMARY
---

| RESULT | LAYOUT NETLIST | LOGICAL NETLIST |
|---|---|---|
| CORRECT | AND2MO5D | AND2MO5D |
| CORRECT | AND2M075D | AND2M075D |
| CORRECT | AND2M10D | AND2M10D |
| CORRECT | AND2M12D | AND2M12D |
| CORRECT | RR1104X72_211HD4 | RR1104X72_211HD4 |
| CORRECT | RR_CONTEXTRAM | RR_CONTEXTRAM |
| INCORRECT | CHIP | |

CELL COMPARISON RESULTS (TOP LEVEL)

ERROR: DIFFERENT NUMBERS OF NETS (SEE BELOW).
ERROR: CONNECTIVITY ERRORS.
WARNING: AMBIGUITY POINTS WERE FOUND AND RESOLVED ARBITRARILY.

LAYOUT CELL NAME:     CHIP
SOURCE CELL NAME:     LOGICAL SCHEMATIC DESIGN
---
INCORRECT NETS

| DISC# LAYOUT NAME | DISC# LAYOUT NAME |
|---|---|
---

1  NET VDD                                                          VDD
     LSI_MRSN_CLK_001035484_NET_U_FUSE_ISOLATOR_BUFFER_Z

902 { 
2  X261/X0(-16.005,2544.465) RR512X38_222              XL5045L RR512X38_222
     119:VSS                                  "MISSING PORT"
---

904 {
    X97/X14174/X0(-702.755,906.810) ND2M1RC          X!8ABBEL ND2M1RC
      Z:X97/17816                                    Z:N!9EDA5L
      A:X97/29728                                    A:N!9EDEAL
      VDD:VDD                                        VDD:VDD
      VSS:VSS                                        VSS:VSS
      B:99046                                        N!6FA6L
      NO SIMILAR NET                             B:N!9ED87L
---

X104/X105767(-1774.085,2255.110) BUFM3RC         X!8A185L BUFM3RC
      Z: 127133                                      Z:N!9E2D6L
      VDD:VDD                                        VDD:VDD
      VSS:VSS                                        VSS:VSS
      A:90502                                        N!7133L
      NO SIMILAR NET                             A:N!9E2D5L
---
SUMMARY
---
TOTAL CPU TIME:       897 SEC
TOTAL ELAPSED TIME:   957 SEC

FIGURE 9

METHOD AND SYSTEM FOR LAYOUT VERSUS SCHEMATIC VALIDATION OF INTEGRATED CIRCUIT DESIGNS

BACKGROUND OF THE INVENTION

1. Technical Field

The present invention relates generally to microelectronic integrated circuits. In particular, the present invention relates to a method, computer program product, and an apparatus for reducing turn-around-time in the physical design layout, routing and verification cycle of a microelectronic integrated circuit.

2. Description of the Related Art

Microelectronic integrated circuits (ICs) are fabricated by layering several different materials on a semiconductor wafer. The typical integrated circuit is formed from dozens of layers. These layers can be formed by depositing material on the integrated circuit such as metal and poly, growing material on the integrated circuit such as oxides, or doping areas of the integrated circuit with different impurities.

The design of the integrated circuit is a two part process. First, integrated circuits are functionally designed in a schematic circuit format. Secondly, the schematic format is then input into a physical layout environment wherein the layout of the polygons that make up the circuitry are physically designed.

The schematic design is developed by assembling a circuit from a collection of fundamental building blocks, known as library circuit elements, in a computer implemented environment. Basic circuit elements, such as transistors are reused over and over in a single integrated circuit. Most designs assemble groups of circuit elements into cells, and groups of cells into blocks. These blocks implement basic input/output (I/O), logic, analog and memory functions. The cells and blocks are then treated in the schematic design as a functional "black boxes" with ports defined to connect the blocks to other circuitry, with the internal definitions of the cells and blocks stored in another file. As "instances" of the same cell or block are reused in the integrated circuit design, the individual instances of the cells and blocks are implemented in the integrated circuit with unique names. The cells, and blocks are built up into a hierarchy of circuit elements and may be used again and again in the integrated circuit design (and in future integrated circuit designs). Designers prefer to reuse these blocks rather than recreating these common circuit elements for each new project. These blocks are ones that have proven quality and so their implementation saves time and resources. Larger reusable blocks, known as intellectual property (IP) blocks, can be designed in house, can be proprietary to a particular design house, or can be licensed from an outside vendor. Intellectual property blocks are supplied in either "hard" or "soft" form. A soft intellectual property block is simply a schematic design performing a given function. A hard intellectual property block specifies the physical layout as well, including the placement and wiring of individual elements. An integrated circuit design may primarily consist of intellectual property blocks and the interconnections between them. Each intellectual property block has at least one and typically more connection ports.

A port is an electrical connection point between the inner structure of a block and the integrated circuit interconnection circuitry outside the cell or block. A net is a set of two or more ports which are connected. Because a typical integrated circuit, at the lowest level of cell hierarchy, has hundreds of thousands of ports which must be connected in various combinations, the integrated circuit also has hundreds of thousands of nets, or sets of ports. All the ports of a net are connected. The number of nets for an integrated circuit is typically of the same order or greater than the order of the number of cells on that integrated circuit. However, looking at the highest level of integrated circuit hierarchy for an integrated circuit that consists primarily of hard intellectual property blocks, the number of ports for the integrated circuit is reduced to several hundred. Thus, the number of nets for the highest level of hierarchy of an integrated circuit is also reduced.

A netlist is a list of nets for an integrated circuit. Thus, a netlist is a file that contains the conversion of a high-level electronic circuit description into a list of cells and blocks and their interconnections. A netlist describes the device structures and connectivity of an electronic design. Netlists usually convey connectivity information and provide instances of cells and blocks, nets, and perhaps some attributes. Netlists can be flat or hierarchical. A flat (sometimes called exploded) netlist is a netlist of the lowest level of integrated circuit hierarchy. A hierarchical netlist preserves the cell, block and intellectual property block hierarchy used in the design. A flat (the lowest level of hierarchy) netlist has hundreds of thousands of lines of block and interconnection description. A hierarchical netlist (at least two levels of hierarchy) for the same integrated circuit may have only several hundred lines of interconnection description. All of the underlying circuitry and connectivity of the internals of the blocks are contained in a definition file. Hierarchical designs can be flattened into flat designs via recursive algorithms. This will generate a much larger database, but will also preserve the hierarchy. By providing a list of the instance names as one descends a hierarchy from the top definition to the lower definitions, one can derive a unique hierarchical path to any instance. These paths can be used to tie a flat design description to a hierarchical version of the same design. A netlist produced from the schematic design of the integrated circuit is called a schematic netlist.

The physical design of an integrated circuit transforms a circuit description into a geometric description which is known as a layout. A layout consists of a set of planar geometric shapes defining the topography of the integrated circuit layers. Upon completion and verification, the layout is then converted into pattern generator files that are used to produce patterns called masks or reticles by an optical or electron beam pattern generator. These reticles are used to pattern each layer. The typical integrated circuit will have many reticles. Due to the large number of components and the exacting details required by the fabrication process, layout design is not practical without the aid of computers. As a result, most phases of layout design extensively use computer aided design (CAD) tools, and many phases have already been partially or fully automated. One example of a physical layout computer aided design tool is the IC Station® Tool Suite from Mentor Graphics. Mentor Graphics is located in Wilsonville, Oreg. This tool includes application bundles for schematic-driven layout, editing the layout, and top-level floor planning and interconnection routing.

The objective of physical design is to determine an optimal arrangement of cells and blocks and an efficient interconnection or routing scheme between them to obtain the desired functionality in the smallest area practical. The input to the physical design computer aided design tool is typically a schematic of the circuit, in the form of a schematic netlist. The output of physical design computer aided design tool is a geometric design system (GDSII) file, stored in the geometric design system database which specifies the physical polygons making up each layer of the circuit. Geometric design system file format is the current industry de facto standard, the format is owned by Cadence®. Geometric design system stream format is a binary format for representation of planar geometric shapes, text labels and some other information in hierarchical form. Geometric design system is the most commonly used format for transfer of integrated circuit layout data between design tools from different vendors which operate with proprietary data formats. Some integrated circuit design tools are beginning to support a new format, Open Artwork System Interchange Standard (OASIS(™)).

After the layout (or a portion of the layout) has been finished, the next step is the verification analysis. Verification analysis consists of extracting the layout design file and comparing it against the schematic design file. A verification software tool is used in this process. An example of third party verification software tool is Calibre® a registered trademark of the Mentor Graphics, Inc. A verification software tool performs the function of providing device and connectivity comparisons between the integrated circuit layout and the schematic. The layout versus schematic verification comparison is the process of comparing the schematic netlist against the layout netlist.

Using a set of instructional code input into the verification software tool, called a rundeck; the verification software tool does the verification in a two step process; extraction and comparison. The rundeck gives instructions to the verification software tool and identifies the correct files needed for the verification. These files include the geometric design system layout database, the schematic netlist from the designer, the cell definition file including intellectual property blocks, and a pad reference file. A typical rundeck is a set of code that contains the location of all of the files needed for comparison between the schematic and the layout as well as other lines of code containing the information needed to extract the device and connectivity of the integrated circuit. This other information includes layer definitions which identifies the layers that are used in the layout file and matches a description of a layer to the layer's location in the geometric design system file. Also included in the rundeck are additional device structures definitions. Additional device structure definitions are device structures that are defined in the rundeck and not found in the cell definition file. An example of these additional device structures may be capacitors that are defined in metal layers.

A pad is where the integrated circuit is eventually connected to the outside world. Signals to and from the integrated circuit go through the pads. A pad reference file identifies what types of signals are designed for each pad; the layout coordinates of the pad and the pad's layer in the geometric design system file. The rundeck references the appropriate pad reference file whether verification is to be run on an entire integrated circuit or a subpart of the integrated circuit such as a hard intellectual property block.

In the first step of the verification analysis, the verification software tool first takes the geometric design system file and breaks it down into a layout netlist file. This process is called extraction. During extraction, the verification software tool flattens the layout design into its most basic design elements, such as individual Nmos and Pmos transistors. The verification software tool does this by recognizing layers and shapes that make up circuitry or the by the cell definitions that are defined in the cell definition file and the additional device structure definitions contained in the rundeck. Optionally, based on a verification software tool selection, the extraction process could extract a higher level of hierarchy of the layout contained in the geometric design system database. The verification software tool extraction process will identify unintentional circuit elements in the layout even during a high level hierarchical extraction. The verification software tool will recognize cell definitions if defined layers and shapes are present in the geometric design system database. The extraction of unintentional circuit structure, such as parasitic capacitors or transistors can be a valuable tool for layout engineers. However, if the unintentional circuit structure has been resolved in previous iterations of the integrated circuit verification, the unintentional circuit structure extraction add bulk and complexity to the layout netlist.

The second step in the verification analysis process is the comparison of the schematic netlist versus the extracted layout netlist. The comparison environment of the verification software tool uses the rundeck to identify the schematic netlist to be compared to the layout netlist produced by the verification software tool's extraction environment. The intention of the physical layout process is to implement the schematic design of the integrated circuit into the space and layers of the integrated circuit. Therefore, the schematic netlist and the layout netlist must match for verification to be completed without error. As the size and complexity of the extracted layout netlist increases, so does the resulting comparison process. Schemes to do the comparison are well known to those of ordinary skill in the art and will not be further discussed here.

The output of the verification software tool is a Layout Versus Schematic (LVS) Error Report. The layout engineer uses the Layout Versus Schematic Error Report to resolve any mismatches between the schematic netlist and the layout netlist. Any additional bulk and complexity in the layout netlist extracted translates into a longer and more complex Layout Versus Schematic Error Report.

SUMMARY OF THE INVENTION

The present invention provides a method, a computer program product and an apparatus for performing a verification analysis. Layers of interest are selected for a trimmed verification analysis. This selection eliminates layer definitions for unselected layers to create a trimmed rundeck. A layout versus schematic verification comparison is performed to generate a trimmed error report for the selected layers of interest. The trimmed error report may then be interpreted.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 8 contrasts the trimmed rundeck with a conventional rundeck in accordance with an illustrative embodiment of the present invention; and FIG. 9 is an illustration of a Layout Versus Schematic Error Report in accordance with the present embodiment of the invention.

DETAILED DESCRIPTION

Figure 1:
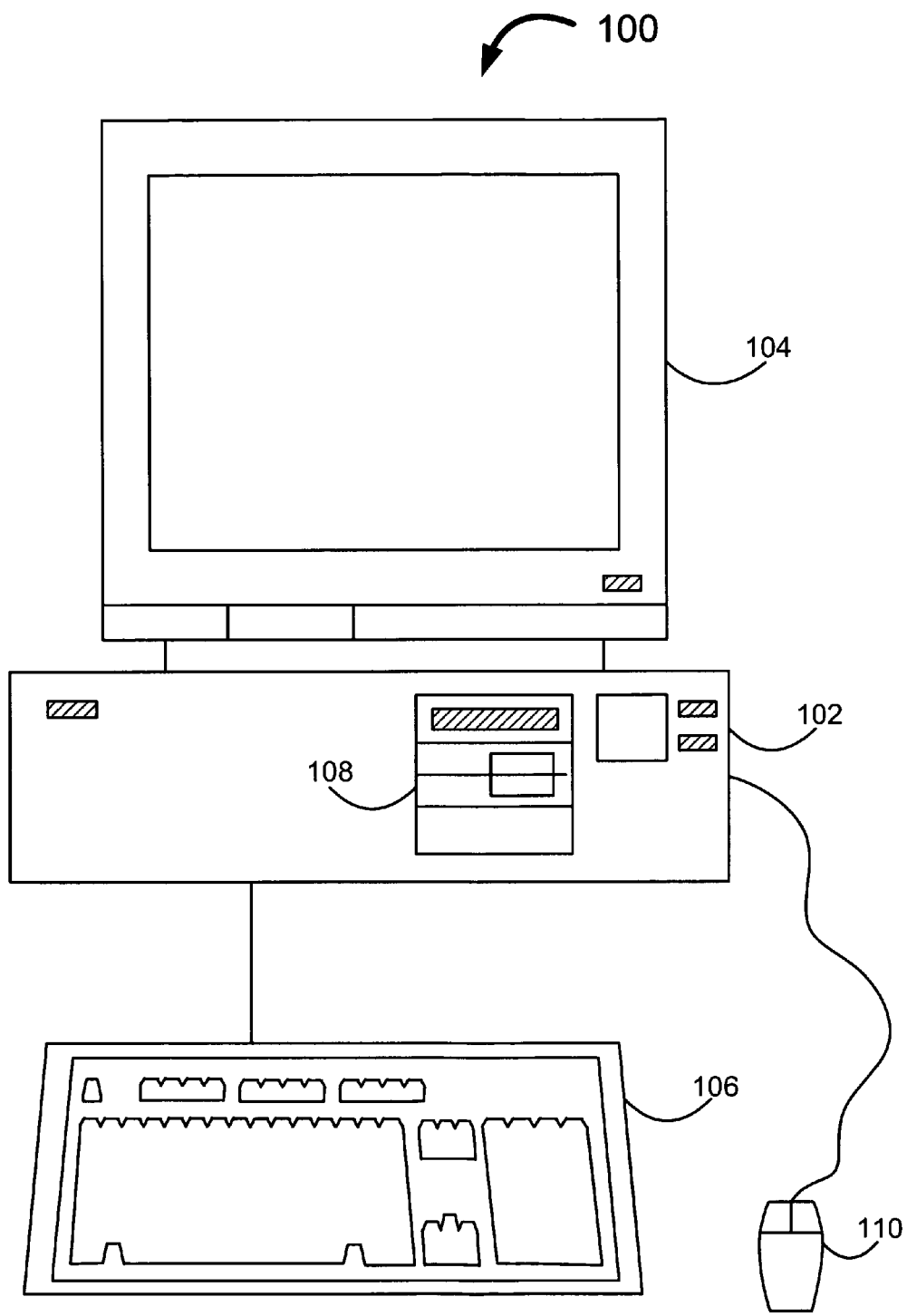
FIG. 1 is a pictorial representation of a data processing system in which aspects of the present invention may be implemented.

With reference now to the figures and in particular with reference to FIG. 1, a pictorial representation of a data processing system in which the aspects of the present invention may be implemented. A computer 100 is depicted which includes system unit 102, video display terminal 104, keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like. Computer 100 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface (GUI) that may be implemented by means of systems software residing in computer readable media in operation within computer 100.

Figure 2:
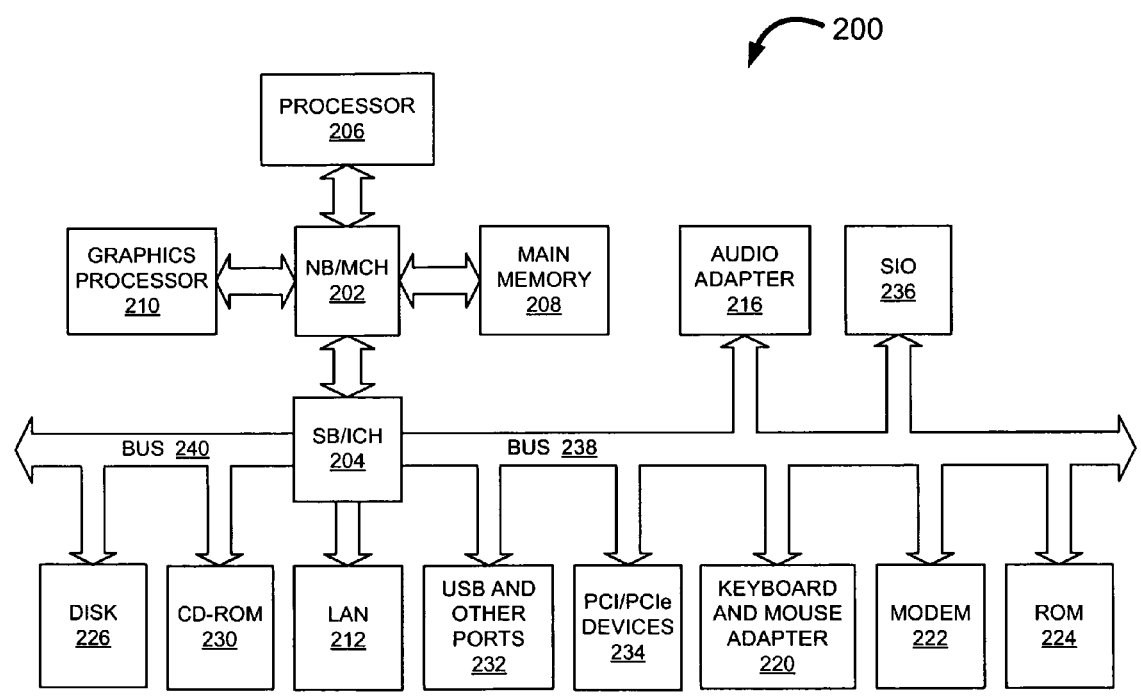
FIG. 2 is a block diagram of a data processing system in which aspects of the present invention may be implemented.

With reference now to FIG. 2, a block diagram of a data processing system is shown in which aspects of the present invention may be implemented. Data processing system 200 is an example of a computer, such as computer 100 in FIG. 1, in which code or instructions implementing the processes of the present invention may be located. In the depicted example, data processing system 200 employs a hub architecture including a north bridge and memory controller hub (MCH) 202 and a south bridge and input/output (I/O) controller hub (ICH) 204. Processor 206, main memory 208, and graphics processor 210 are connected to north bridge and memory controller hub 202. Graphics processor 210 may be connected to the MCH through an accelerated graphics port (AGP), for example.

In the depicted example, local area network (LAN) adapter 212 connects to south bridge and I/O controller hub 204 and audio adapter 216, keyboard and mouse adapter 220, modem 222, read only memory (ROM) 224, hard disk drive (HDD) 226, CD-ROM drive 230, universal serial bus (USB) ports and other communications ports 232, and PCI/PCIe devices 234 connect to south bridge and I/O controller hub 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM drive 230 may use, for example, an integrated drive electronics (IDE) or serial advanced technology attachment (SATA) interface. A super I/O (SIO) device 236 may be connected to south bridge and I/O controller hub 204.

An operating system runs on processor 206 and coordinates and provides control of various components within data processing system 200 in FIG. 2. The operating system may be a commercially available operating system such as Microsoft® Windows® XP (Microsoft and Windows are trademarks of Microsoft Corporation in the United States, other countries, or both). An object oriented programming system, such as the Java™ programming system, may run in conjunction with the operating system and provides calls to the operating system from Java programs or applications executing on data processing system 200 (Java is a trademark of Sun Microsystems, Inc. in the United States, other countries, or both).

Instructions for the operating system, the object-oriented programming system, and applications or programs are located on storage devices, such as hard disk drive 226, and may be loaded into main memory 208 for execution by processor 206. The processes of the present invention are performed by processor 206 using computer implemented instructions, which may be located in a memory such as, for example, main memory 208, read only memory 224, or in one or more peripheral devices.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the present invention may be applied to a multiprocessor data processing system or through out several different processors and operating systems at the same time.

In some illustrative examples, data processing system 200 may be a personal digital assistant (PDA), which is configured with flash memory to provide non-volatile memory for storing operating system files and/or user-generated data. A bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 208 or a cache such as found in north bridge and memory controller hub 202. A processing unit may include one or more processors or CPUs. The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
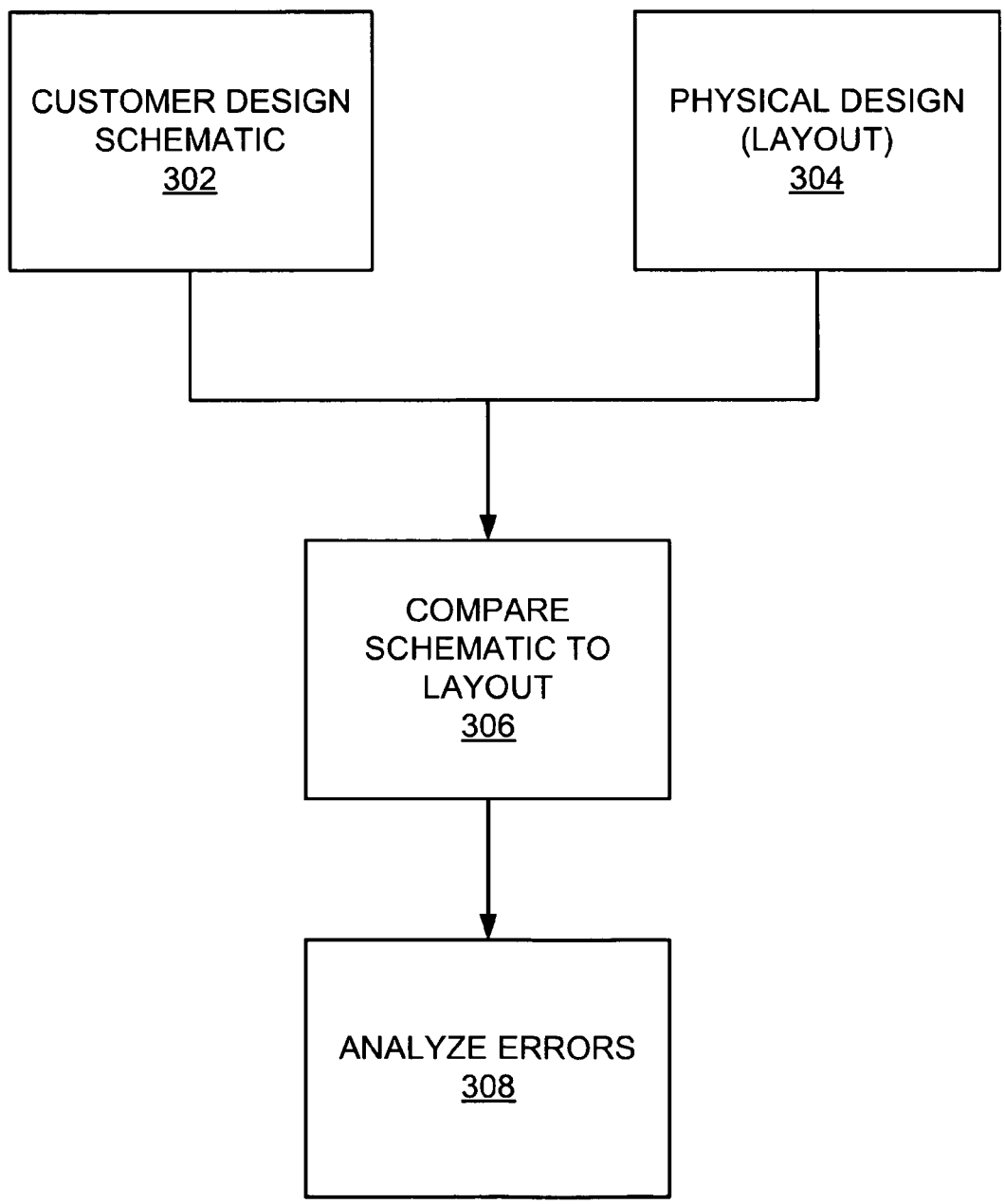
FIG. 3 is an overview of the process flow of the schematic design to physical layout process in which aspects of the present invention may be implemented.

With reference now to FIG. 3, a block diagram of an overview of the schematic design to physical layout process in which aspects of the present invention may be implemented. These steps are implemented in these examples using a computer as is described in FIGS. 1 and 2. Customer design of the integrated circuit and generation of the schematic netlist (step 302) may be completed in house or by a customer design house. The schematic design software environment, termed electrical design software (EDS), in step 302 enables a designer to select functional elements of a circuit and connect them together in a schematic. The schematic netlist, output from the electrical design software in step 302, is a key component of the schematic design to physical layout process. Physical design layout is implemented in a physical layout computer aided design tool, (step 304). The physical layout computer aided design tool in step 304 outputs a layout file that resides in a geometric design system database. The integrated circuit's cell and block configuration and all of the conducting routes interconnecting the cells and blocks are planned in physical design layout in step 304.

The schematic design and layout design are compared in comparison of schematic to layout (step 306). Errors or mismatches between the schematic design and the layout design are analyzed in analysis of errors (step 308). Unintended circuitries are displayed in the error report and are interpreted in step 308, analysis of errors. Examples of errors found in error reporting in step 308 are: ports that are not connected to interconnect in the layout design and cells and blocks that appear in the schematic design but not in the layout design or in the layout design but not in the schematic design. The engineer may then decide to edit layout design, returning to step 304 or ignore a previously analyzed unintentional circuitry. After edits are complete, the compare in step 306 may be rerun. This iterative process continues until the layout is free from errors.

Figure 4:
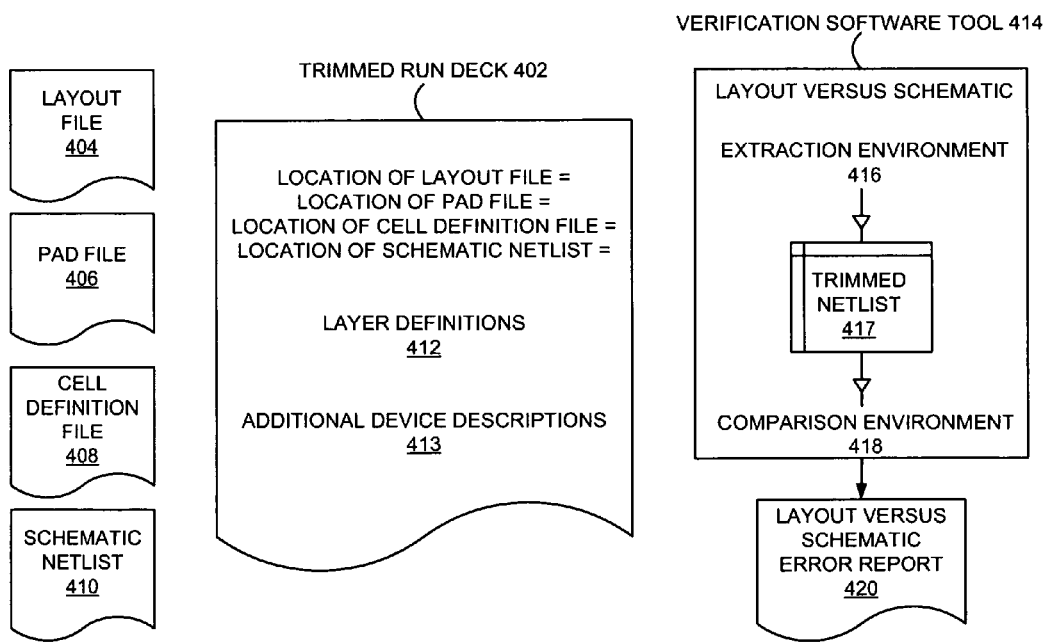
FIG. 4 is a diagram of the components of the verification analysis process in which aspects of the present invention may be implemented.

Turning now to FIG. 4, a diagram consists of the components of the verification analysis process in accordance with an illustrative embodiment of the present invention. FIG. 4 shows details of components in step 306 and step 308 of FIG. 3. One component in accordance with the illustrative embodiment of the present invention is trimmed rundeck 402. However, any method of delivering instructions to a verification software tool is within the spirit of the present invention. Trimmed rundeck 402 is the instruction set for verification software tool 414 and contains the locations of geometric design system layout file 404, pad file 406, cell and block definition file 408, and schematic netlist 410, as well as trimmed layer definitions 412 and trimmed additional device structure descriptions 413. Data for a layer is available to the verification software tool only if the layer is defined in the rundeck. The layer definition points to the layer's location in the geometric design system layout file. In accordance with an illustrative embodiment of the present invention, trimmed rundeck 402 is a heavily edited version of a conventional rundeck. Trimmed layer definitions and trimmed additional device structure descriptions are the rundeck code segments that have unnecessary layer definitions and additional device structure descriptions edited from them, leaving only the layers of interest and device structures of interest to be analyzed. Extraction environment 416 and comparison environment 418 are within verification software tool 414. Extraction environment 416 uses the files and instructions contained in trimmed rundeck 402 to extract a trimmed netlist 417 from the geometric design system layout file 404. The present invention is not intended to be limited by the format of the layout file, other layout file protocols may be used in accordance with an illustrative embodiment of the present invention.

Figure 5:
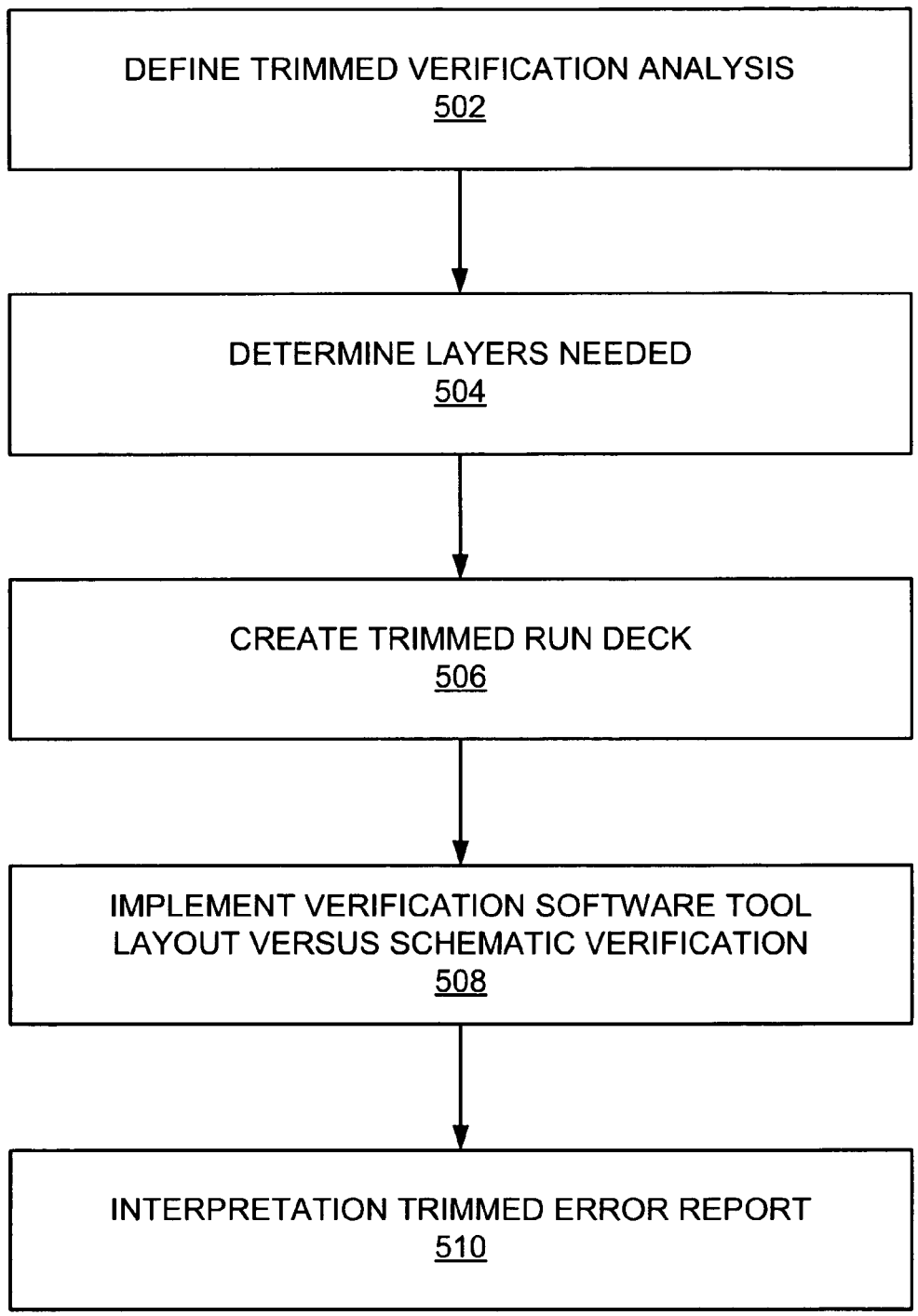
FIG. 5 is a flowchart of a process for trimming verification analysis in accordance with an illustrative embodiment of the present invention.

Turning now to FIG. 5, a flowchart of a process for trimming the verification analysis is depicted in accordance with an illustrative embodiment of the present invention. FIG. 5 is an alternate method to the typical verification analysis depicted in the comparing step 306 of FIG. 3, and analyzing errors step 308 of FIG. 3. The verification analysis to be performed is determined in the define trimmed verification analysis (step 502). A trimmed verification analysis is a verification analysis with only the layers of interest and the device structures of interest included in the verification analysis. The remaining layers and device structure definitions are trimmed from the analysis. Some factors that may influence the choice of trimmed verification analysis may include, the number of hard intellectual property blocks populating the design and the amount of analysis that has previously been completed.

According to an illustrative embodiment of the present invention the analysis chosen is the metal interconnect structures. Of course other types of analysis may be accomplished using the aspects of the present invention. Another example is a poly interconnect analysis.

Next, the layers to be extracted for the trimmed verification analysis are determined (step 504). In this example, the determination is made by selecting all the layers of interest for the analysis and excluding all layers not of interest. The criteria for selecting the layers of interest are based on the subject of the trimmed verification analysis. For example, in accordance with an illustrative embodiment of the present invention, the integrated circuit to be analyzed may be entirely designed using hard intellectual property blocks. Metal interconnect layers may be the only original circuitry in the integrated circuit, therefore isolating these layers in the trimmed verification analysis is beneficial. Those of ordinary skill in the art will recognize that the layers chosen for analysis and the layers that interconnect those layers will be the only layers desired in the trimmed verification analysis. The connectivity between the blocks, of which these layers are a part, is determined by the port references on the blocks. A port reference is the location and name of a port. In an illustrative embodiment of the present invention, the metal and the metal related layers are all that is needed to analyze the metal interconnect. Therefore many layers will not be defined in the rundeck. Typical integrated circuits have greater than twenty layers. Examples of layers not of interest in this analysis are all layers underlying metal 1. Elimination of the unnecessary layers of the integrated circuit from layer definitions of rundeck is made because verification software tool will detect unintentional circuitry that are not part of the analysis in accordance with an illustrative embodiment of the present invention. So, for example, if the substrate, p-well, n+implant and poly layers are defined in a rundeck unintentional parasitic transistors may be extracted by verification software tool that would add unnecessary bulk and complexity to the analysis.

A specifically trimmed rundeck is created (step 506) in accordance with an illustrative embodiment of the present invention, using only the lines of instructional code necessary for the extraction of the necessary layers from geometric design system layout file. In accordance with an illustrative embodiment of the present invention several layers are selected for analysis, metal 1, metal 2, metal 3, via12, and via23, therefore only these layers will be defined in trimmed rundeck. The remaining layers are eliminated from the trimmed verification analysis by removing the unwanted layer definitions and any unwanted additional device structure definitions from trimmed rundeck.

Next, layout versus schematic verification is implemented (step 508). In this step, a trimmed rundeck, is input to verification software tool. Verification software tool, implemented on a computer such as is illustrated in FIGS. 1 and 2, extracts a trimmed layout netlist in the first part of the layout versus schematic verification in step 508. Then, the process compares trimmed layout netlist to schematic netlist in second part of the layout versus schematic verification in step 508.

Lastly, verification software tool outputs a trimmed error report used in the interpretation and analysis of the data (step 510). A trimmed error report is produced by verification software tool as a trimmed error report only because the input to verification software tool is trimmed. From the standpoint of verification software tool, a trimmed error report is a standard error report output. The computer time and resources to complete this process in accordance with the illustrative embodiment of the present invention are significantly reduced due to the elimination of data not pertinent to the present invention's analysis. Interpretation of trimmed error report data in step 510 is also significantly reduced in that the errors listed in the error report are only those errors pertinent to the present invention's analysis.

Figure 6A:
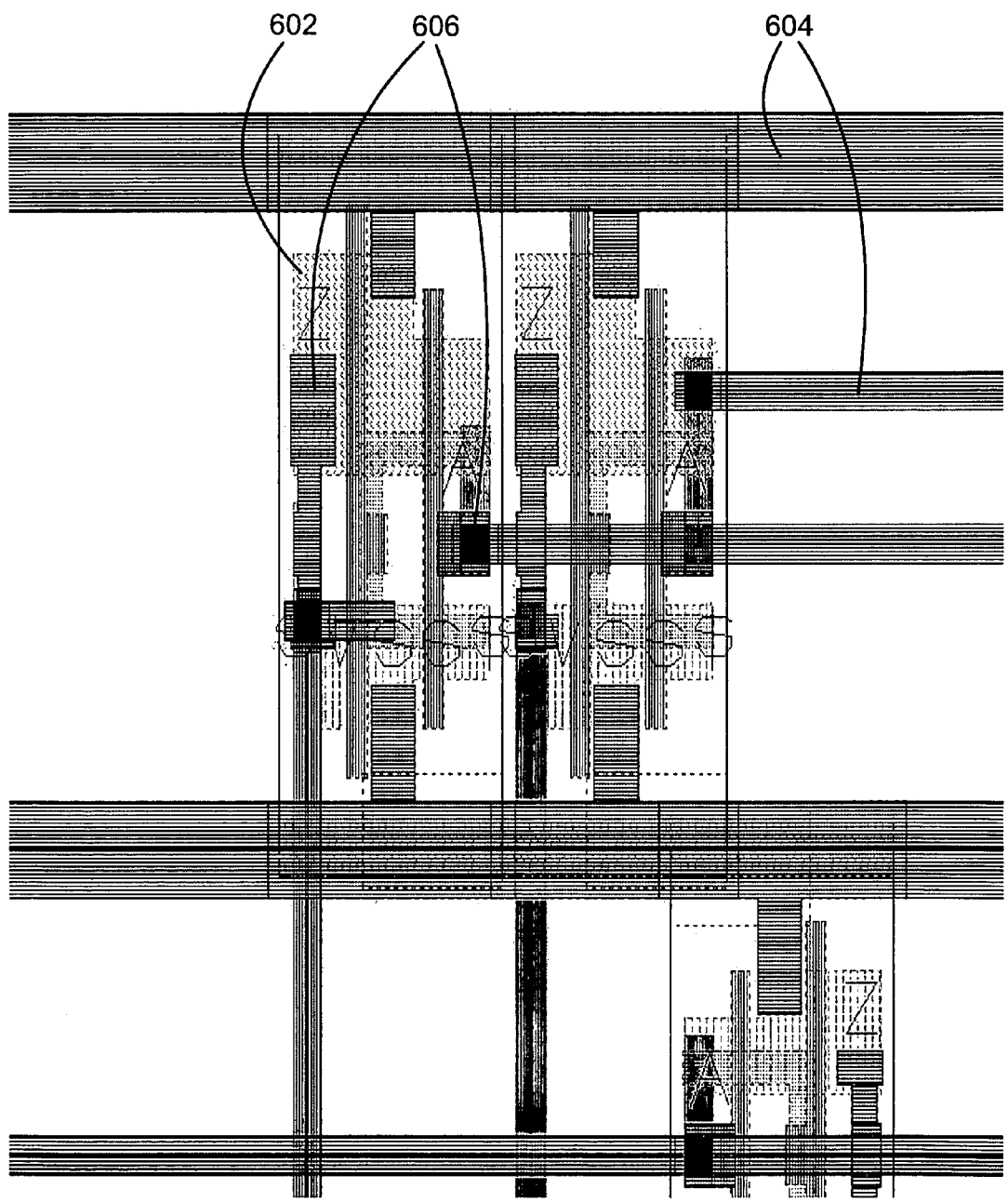
FIGS. 6A and 6B are top views of a block, 6A shows all the layers of the block and 6B shows only the metal related areas of the block in accordance with an illustrative embodiment of the present invention.
Figure 6B:
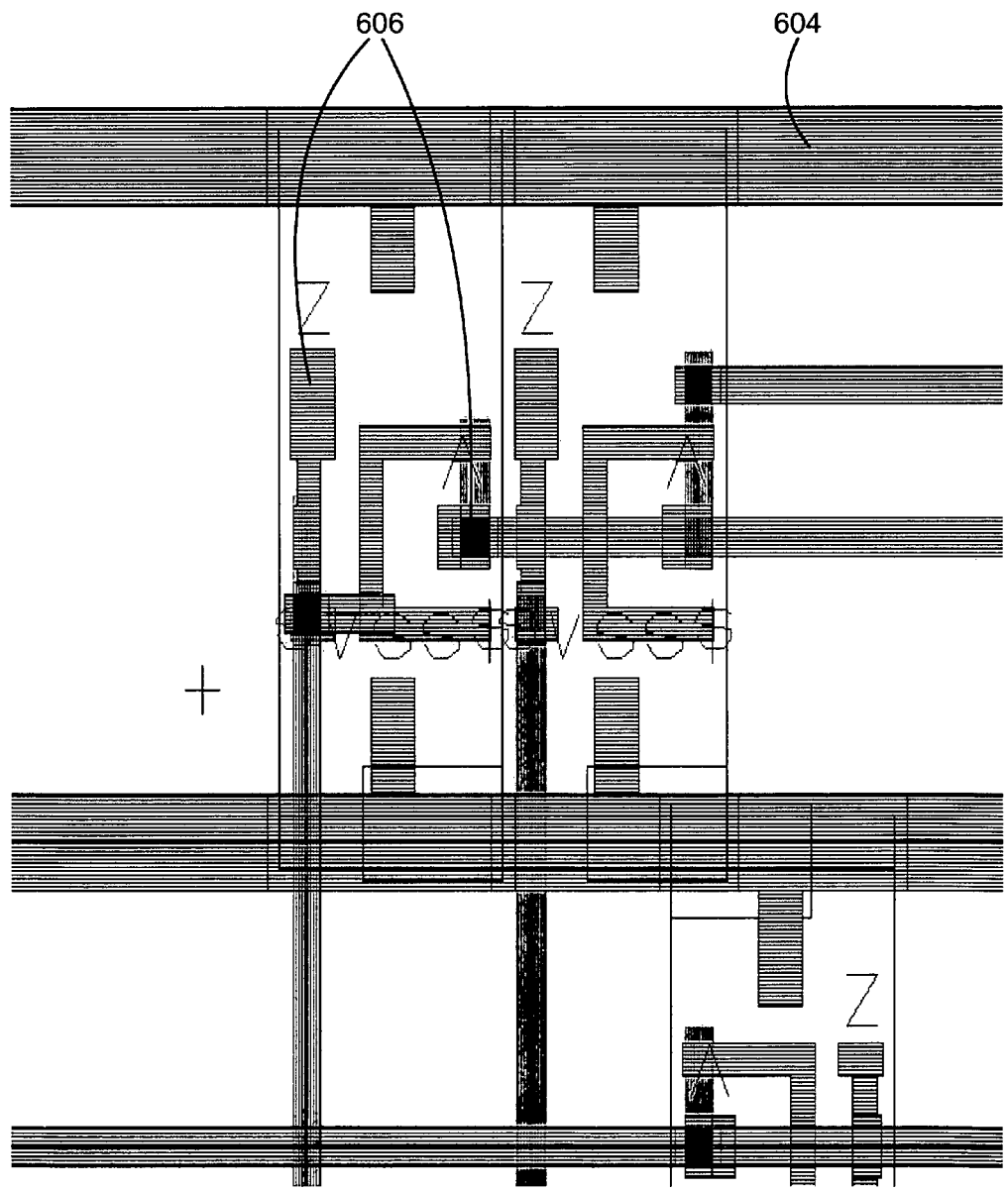

FIGS. 6A and 6B are drawings output from physical design layout, each showing the top view of the same simple block in accordance with an illustrative embodiment of the present invention. The drawings depict a small example of layout that illustrates the definition of the trimmed analysis in step 502 of FIG. 5. FIG. 6A shows the simple block with all of the integrated circuit layers included in the layout depicted. FIG. 6B shows the same simple block with only the layers selected in the present embodiment of the invention. In this embodiment of the invention only the metal interconnection layers are to be analyzed. FIG. 6A shows the simple block including the underlying regions 602 of the integrated circuit structure. Underlying regions 602 may indicate many layers of integrated circuit processing. An example of layers unnecessary to the analysis, according to the illustrative embodiment of the present invention, are the layers of contact, silicide, poly, n+implant, p-well regions, and substrate, which are all part of underlying regions 602. Metal interconnect layers 604 are the darkly cross-hatched areas in FIGS. 6A and 6B. In this simple example these layers are metal-3, metal-2, and metal-1. A port is a connection point between the functional logic of a block and the circuitry outside the block. The labels A and Z indicate ports 606 or connection points of this block between its underlying layers 602 and its integrated circuit metal interconnect layers 604. Port connection points are defined in the schematic and layout netlists for each block. FIG. 6B is the same cell with only metal 604 and metal related layers 606 shown, illustrating the layers selected in the illustrative embodiment of the present invention. In accordance with the illustrative embodiment of the present invention, defining only the layers in the analysis in trimmed run set would effectively cause the verification software tool to extract and compare only the layers and structures in FIG. 6B, building the connection net for the block using ports 606.

Figure 7:
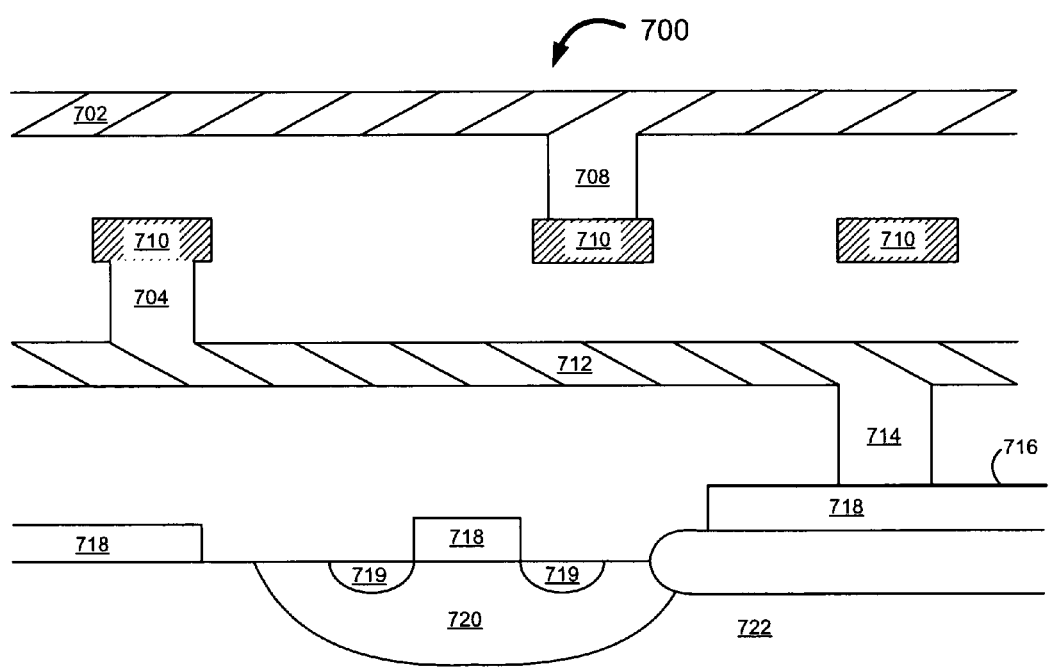
FIG. 7 is a diagram of a cross section of a microelectronic device in accordance with an illustrative embodiment of the present invention.

FIG. 7 is a simplified cross sectional diagram of a typical integrated circuit depicting some of the layers that are used in the layout of integrated circuits in accordance with an illustrative embodiment of the present invention. Information in cross section 700 individual to the process flow used in integrated circuit manufacturing may be used in determining layers of interest. In an illustrative embodiment of the present invention, the layers chosen for analysis are metal and metal related layers. The remaining layers are excluded from this analysis. This allows engineering to analyze only the interconnections between high level IP blocks, thus saving the expense of extracting, comparing and debugging all of the components in the integrated circuits underlying layers and circuitry. In FIG. 7, there are three metal layers, metal-3 702, metal-2 710, and metal-1 712. Two metal related layers depicted are via-12 704 and via-23 708. Those of ordinary skill in the art will appreciate that there may be less or many more metal and metal related layers. Other layers depicted are contact 714, silicide 716, poly 718, n+implant 719, p-well regions 720, and substrate 722. These are layers underlying the metal and metal related layers. Again many more layers are typically found in an integrated circuit design, these layers are depicted for simplification. As can be seen from cross section 700, process steps are called layers in the layout step when either a physical layer is created or part of a physical layer is altered. Therefore according to layout nomenclature n+implant 719 is a layer although physically n+implant 719 is a region within the p-well layer 720.

FIG. 8 illustrates a comparison between a trimmed rundeck 402 of FIG. 4 and a conventional rundeck in accordance with an illustrative embodiment of the present invention. Creating a trimmed rundeck can be, but is not limited to, implementation by editing a rundeck created to extract all the layers of the integrated circuit. File location segment 802 of the trimmed rundeck and the conventional rundeck are identical. Layer definition segment 804 of the trimmed rundeck contains only the layers necessary for the present invention's analysis. Layers such as contact, silicide, poly, n+implant, p-well regions, and substrate are not listed in the trimmed rundeck. These underlying layers are not necessary to the present invention analysis. Layer definition segment 804 for the conventional rundeck contains all of the layers contained in the geometric design system layout file. Additional device structure definition segment 806 in accordance with the illustrative embodiment of the present invention is empty, while additional cell description segment 806 in the conventional rundeck has an example of a capacitor definition in it and may have a hundred lines of code describing additional capacitors or other cell structures.

FIG. 9 depicts a segment of a layout versus schematic error report 900 in accordance with an illustrative embodiment of the present invention. Example error 902 is an illustration of blocks matching in the schematic and layout netlists but there is a short between the net and the integrated circuit power supply (VDD). The schematic netlist indicates there should be two separate nets. Example error 904 is an illustration of blocks mismatching between the layout and schematic netlists. The layout versus schematic error report produced in accordance with the illustrative embodiment of the present invention is in the same format as the conventional error report but is significantly shorter and less complex than the conventional layout versus schematic error report, thus saving engineering resources in the debug process.

The aspects of the present invention provide a method and a computer program product for performing a trimmed verification analysis. The method comprises selecting layers of interest for a trimmed analysis, eliminating layer definitions for unselected layers to create a trimmed rundeck, and performing a layout versus schematic verification comparison to generate a trimmed error report for the selected layers of interest.

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A method for performing a trimmed verification analysis in an integrated circuit (IC), the method comprising:
   selecting IC layer definitions of interest and additional device structure descriptions of interest;
   creating a rundeck including the selections;
   analyzing the created rundeck, wherein the analyzing comprises:
   selecting a geometric design system file from the created rundeck;
   extracting a layout netlist from the geometric design system file;
   selecting a schematic netlist from the created rundeck; and comparing the schematic netlist with the layout netlist; and generating an error report based on a result of the analysis.

2. The method of claim 1, wherein the selecting comprises:

determining IC layers of interest and additional device structures of interest based on a type of verification analysis to be performed between functional blocks in the IC.

3. The method of claim 2, wherein the type of verification analysis comprises a metal interconnect structure analysis based on a connectivity between the functional blocks.

4. The method of claim 3, wherein the type of verification analysis further comprises a poly interconnect analysis.

5. The method of claim 1, wherein the selecting comprises extracting metal interconnect layer definitions based on port connection points between functional blocks in the IC.

6. A computer program product comprising a computer usable medium including computer usable program instructions for performing a trimmed verification analysis, the instructions when executed by a processor performing actions comprising:

selecting IC layer definitions of interest and additional device structure descriptions of interest;

creating a rundeck including the selections;

analyzing the created rundeck, wherein the analyzing comprises:

selecting a geometric design system file from the created rundeck;

extracting a layout netlist from the geometric design system file;

selecting a schematic netlist from the rundeck; and comparing the schematic netlist with the layout netlist; and generating, by performing a layout versus schematic comparison, an error report based on a result of the analysis.

7. The computer program product of claim 6, wherein the selecting comprises:

determining IC layers of interest and additional device structures of interest based on a selection of a type of verification analysis to be performed.

8. The computer program product of claim 7, wherein the determined IC layers of interest comprise poly layers and the selected type of verification analysis comprises a poly interconnect verification analysis.

9. The computer program product of claim 6, wherein the selecting further comprises extracting metal interconnect layer definitions based on port connection points between functional blocks in the IC.

10. A system for performing a verification analysis, the system comprising:

a storage device connected to a bus, the storage device comprising a computer readable storage medium including instructions; and a processor, wherein the processor executes the instructions that select IC layer definitions of interest and additional device structure description of interest;

create a rundeck including the selections, based on a type of verification analysis to be performed;

analyze the created rundeck by performing a layout versus schematic comparison, wherein the analyzing comprises:

selecting a geometric design system file from the created rundeck;

extracting a layout netlist from the geometric design system file;

selecting a schematic netlist from the rundeck; and comparing the schematic netlist with the layout netlist; and generate an error report based on a result of the analysis.

* * * * *